United States Patent
Armstrong et al.

(10) Patent No.: US 10,388,753 B1
(45) Date of Patent: Aug. 20, 2019

(54) REGROWTH METHOD FOR FABRICATING WIDE-BANDGAP TRANSISTORS, AND DEVICES MADE THEREBY

(71) Applicant: National Technology & Engineering Solutions of Sandia, LLC, Albuquerque, NM (US)

(72) Inventors: Andrew Armstrong, Albuquerque, NM (US); Albert G. Baca, Albuquerque, NM (US); Andrew A. Allerman, Tijeras, NM (US); Carlos Anthony Sanchez, Belen, NM (US); Erica Ann Douglas, Albuquerque, NM (US); Robert Kaplar, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/921,007

(22) Filed: Mar. 14, 2018

Related U.S. Application Data (60) Provisional application No. 62/479,802, filed on Mar. 31, 2017.

(51) Int. Cl.
*H01L 29/66* (2006.01)
*H01L 29/778* (2006.01)
(Continued)

(52) U.S. Cl.
CPC .... *H01L 29/66462* (2013.01); *H01L 21/0254* (2013.01); *H01L 21/0262* (2013.01);
(Continued)

(58) Field of Classification Search
CPC ......... H01L 29/66431; H01L 29/66462; H01L 29/778; H01L 29/7781; H01L 29/7782;
(Continued)

(56) References Cited

U.S. PATENT DOCUMENTS

| | | | | |
|---|---|---|---|---|
| 2010/0321755 A1* | 12/2010 | Cho | ...................... | G01S 7/4816 |
| | | | | 359/248 |
| 2014/0264379 A1* | 9/2014 | Kub | .................. | H01L 29/41725 |
| | | | | 257/77 |

(Continued)

OTHER PUBLICATIONS

Baca, A. et al., "An AlN/Al0.85Ga0.15N High Electron Mobility Transistor", Appl. Phys Lett., 2016, 033509, vol. 109.

(Continued)

*Primary Examiner* — Eduardo A Rodela
(74) *Attorney, Agent, or Firm* — Martin I. Finston (57) ABSTRACT

Methods are provided for fabricating a HEMT (high-electron-mobility transistor) that involve sequential epitaxial growth of III-nitride channel and barrier layers, followed by epitaxial regrowth of further III-nitride material through a window in a mask layer. In examples, the regrowth takes place over exposed portions of the channel layer in the source and drain regions of the device, and the regrown material has a composition different from the barrier layer. In other examples, the regrowth takes place on the barrier layer, only in the access region or regions. Devices made according to the disclosed methods are also provided.

6 Claims, 7 Drawing Sheets

(51) Int. Cl.
*H01L 21/02* (2006.01)
*H01L 21/306* (2006.01)
*H01L 21/74* (2006.01)
*H01L 21/18* (2006.01)
*H01L 21/203* (2006.01)
*H01L 21/20* (2006.01)

(52) U.S. Cl.
CPC ........ *H01L 21/02642* (2013.01); *H01L 21/18* (2013.01); *H01L 21/20* (2013.01); *H01L 21/2036* (2013.01); *H01L 21/30621* (2013.01); *H01L 21/743* (2013.01); *H01L 21/746* (2013.01); *H01L 29/66431* (2013.01); *H01L 29/778* (2013.01)

(58) Field of Classification Search
CPC ....... H01L 29/7786; H01L 2949/13064; H01L 21/18; H01L 21/182; H01L 21/20; H01L 21/2036; H01L 21/2056; H01L 21/743; H01L 21/746; H01L 21/452
See application file for complete search history.

(56) References Cited

U.S. PATENT DOCUMENTS

| | | | |
|---|---|---|---|
| 2017/0092751 A1* | 3/2017 | Frijlink | H01L 29/66462 |
| 2017/0141218 A1* | 5/2017 | Iucolano | H01L 21/0254 |
| 2017/0183607 A1* | 6/2017 | Shimada | C11D 3/3947 |

OTHER PUBLICATIONS

Baca, A. et al., "An AlN/Al0.85Ga0.15N High Electron Mobility Transistor with a Regrown Ohmic Contact", Sandia National Laboratorie, 2016, SAND2016-5836C.

Douglas, E. A. et al., "Ohmic Contacts to Al0.85Ga0.15N/Al0.7Ga0.3N Heterostructure", Sandia National Laboratories, 2016, SAND2016-11855c.

Bajaj, S. et al., "AlGaN channel field effect transistors with graded heterostructure ohmic contacts", Appl. Phys. Lett., 2016, 133508, vol. 109.

Greenlee, J. et al., "Symmetric Multicycle Rapid Thermal Annealing: Enhanced Activation of Implanted Dopants in GaN", ECS Journal of Solid State Science and Technology, 2015, pp. 382-386, vol. 4.

Kumar, V. et al., "Recessed 0.25 um gate AlGaN/GaN HEMTs on SiC with high gate-drain breakdown voltage using ICP-RIE", Electronics Letters, 2001, pp. 1483-1485, vol. 37.

Nanjo, T. et al., "AlGaN Channel HEMT With Extremely High Breakdown Voltage", IEEE Transactions on Electron Devices, 2013, pp. 1046-1053, vol. 60.

Okamoto, Y. et al., "Improved Power Performance for a Recessed-Gate AlGaN—GaN Heterojunction FET with a Field-Modulating Plate", IEEE Transactions on Mircowave Theory and Techniques, 2004, pp. 2536-2540, vol. 52.

Tokuda, H. et al., "High Al Composition AlGaN-Channel High-Electron Mobility Transistor on AlN Substrate", Applied Physics Express 3, 2010, 121003, vol. 3.

* cited by examiner

REGROWTH METHOD FOR FABRICATING WIDE-BANDGAP TRANSISTORS, AND DEVICES MADE THEREBY

CROSS-REFERENCE TO RELATED APPLICATION

This patent application claims priority from and the benefit of U.S. Provisional Patent Application Ser. No. 62/479,802, filed Mar. 31, 2017 under the title, "Regrowth Method for Fabricating Wide-Bandgap Transistors, and Devices Made Thereby," the entirety of which is hereby incorporated herein by reference.

STATEMENT OF GOVERNMENT INTEREST

This invention was made with United States Government support under Contract No. DE-NA0003525 between National Technology & Engineering Solutions of Sandia, LLC and the United States Department of Energy/National Nuclear Security Administration. The United States Government has certain rights in this invention.

FIELD OF THE INVENTION

The invention relates to semiconductor devices fabricated from materials in the III-nitride material system and to methods for their fabrication.

ART BACKGROUND

UWBG (ultra-wide bandgap) semiconductor electronic devices are of current interest because of high breakdown voltages and other advantages. For example, a HEMT (high electron mobility transistor) fabricated in III-nitrides or another UWBG material system has a theoretical on-resistance, at given breakdown voltages, greater than what other technologies offer.

More specifically, a lateral figure of merit (LFOM) has been defined for lateral power devices whose performance may be limited by conduction losses:

$$LFOM = q\mu n_s E_C^2 = \frac{V_{br}^2}{R_{on,sp}}.$$

In the above equation, p is the electron mobility, q is the electronic charge, $n_s$ is the sheet charge, $E_C$ is the critical field for avalanche breakdown, $V_{br}$ is the off-state breakdown voltage, and $R_{on,sp}$ is the specific on-state resistance. A discussion of the LFOM may be found, for example, in Jordan D. Greenlee et al., *ECS J. Solid-State Sci. Technol.* 4, P382 (2015).

The LFOM favors semiconductor materials with large bandgap, such as the AlGaN alloys and AlN, particularly at high junction temperatures, because the breakdown voltage tends to increase with increasing bandgap. The LFOM also favors smaller values of the specific on-resistance. Reducing the on-resistance at a given operating voltage (as limited by breakdown) is beneficial for applications in power electronics because it can lead to greater efficiency and smaller size, power and weight.

The material parameters limit the maximum theoretical value that the LFOM can reach. In practice, however, the LFOM may be limited by a sub-optimal $V_{br}$ or $R_{on,sp}$. Hence in order to optimize the device performance, it is desirable to design for optimal values of these parameters.

For example, it has proven difficult to provide low-resistance Ohmic contacts for devices fabricated in some material systems. The advantage of LFOM promised by UWBG materials will be unrealized if the Ohmic contacts for the source and drain contact regions have excessively high resistance.

Known approaches in the context of $Al_xGa_{1-x}N/Al_yGa_{1-y}N$ HEMTs involve judicious selection of the metals to optimize conventional Ohmic metal stacks, as well as selective doping of the Ohmic contact regions by ion implantation. However, contact resistivities still remain substantially greater than those typical for GaN and other semiconductors.

Another challenge in UWBG design is that power electronics systems are often required to shut down by default when power to the control circuit is lost. This dictates the use of normally-off, or enhancement-mode, power transistors in which a zero voltage applied to the gate will leave the device in its off condition.

More specifically, electrical conduction in a HEMT depends on the existence of a two-dimensional electron gas (2DEG) near the interface between a channel layer and a barrier layer. The enhancement-mode condition will deplete the charge in the 2DEG, resulting in zero conductivity between the source and the drain. A positive gate voltage will restore conductivity to the channel region under the gate.

There are known techniques for enhancing conductivity in the so-called access regions of a HEMT that lie between the source and the gate and between the gate and the drain. However, not all such techniques are suitable for optimizing the product $\mu \cdot n_s$ in an enhancement-mode channel, as would be required in order to achieve maximum LFOM in an enhancement-mode device.

One such technique is self-aligned ion implantation and annealing of the source-gate and the gate-drain regions to enhance conductivity in those regions. However, ion implantation does not work well in III-nitride materials, and it needs further development before it can receive widespread acceptance.

Another technique, gate recessing, is often used in other III-V material systems such as GaAs. However, gate recessing has limited value when applied to the III-nitride materials because the chemical reactivity of these materials tends to be relatively low, with the consequence that a suitable wet etch for low-damage recessing has not been adopted. Performing a dry etch for gate recessing is feasible, but it can lead to gate leakage and reduced breakdown voltage.

SUMMARY OF THE INVENTION

We have developed new fabrication methods for improving the performance of III-nitride transistors such as an $Al_xGa_{1-x}N/Al_yGa_{1-y}N$ HEMTs. Our new methods involve epitaxial regrowth of III-nitride contact material in the source and drain regions.

Accordingly, embodiments of the invention in a first aspect involve epitaxially growing a III-nitride channel layer on a substrate and epitaxially growing a III-nitride barrier layer on the channel layer. Further processing includes depositing a dielectric mask layer on the barrier layer; opening a window through the dielectric mask layer in the source and drain regions; and etching through the source region window and drain region window so as to remove barrier layer material and thereby leave voids in the barrier layer reaching down to an exposed upper surface of the channel layer. Further processing includes filling the voids in the source and drain regions by epitaxial regrowth of a III-nitride contact material that differs in composition from the barrier layer.

In an approach intended to reduce source and drain contact resistance, Ohmic contacts are formed in an area-selective manner, and compositional grading provides an engineered heterostructure in which the bandgap in the source and drain regions becomes narrower toward the Ohmic contacts so that the Schottky barrier is reduced relative to a non-graded structure.

Accordingly, a selective area etch of the barrier layer is followed by regrowth with compositional grading of, e.g., AlGaN in the region of the source and the drain Ohmic contacts. The semiconductor region between the Ohmic contacts is protected by a thin inert film that will later be removed.

In example embodiments, the AlGaN or other compositionally graded semiconductor is regrown non-selectively and subsequently removed from the protected region while left in place in the source and drain regions. Chemical mechanical polishing (CMP) provides one exemplary method of removal that is useful in this regard. Another possible method is a chemical wet etch.

The Ohmic contacts are then completed by a conventional metal deposition and alloy process.

We discovered that by using a regrowth technique to add GaN beneath the source and drain contact metal, we could successfully fabricate and test an AlGaN/AlN HEMT with an aluminum content in the channel layer as high as 85%.

Accordingly, some embodiments involve the epitaxial growth of an AlGaN channel layer, followed by epitaxial growth of an AlN barrier layer. The source and drain contacts are prepared by etching windows in the AlN barrier layer to expose the AlGaN channel layer. GaN is then epitaxially regrown on the exposed AlGaN to replace the etched-out AlN. Source and drain contact metal and Schottky gate metal are then deposited, followed by the deposition of a passivation layer of a dielectric such as SiN.

We have also discovered that we can reduce the access-region resistivity in HEMTs by using a technique that we developed for regrowing semiconductor material over the barrier layer in the access regions. This technique is intended, in particular, to improve the performance of UWBG enhancement-mode HEMTs in III-nitride material systems such as the $Al_xGa_{1-x}N/Al_yGa_{1-y}N$ material system.

Accordingly, embodiments of the invention in a second aspect involve epitaxial growth of channel and barrier layers of, e.g., $Al_xGa_{1-x}N$ and $Al_yGa_{1-y}N$. The wafer is then masked with a dielectric layer suitable for protection of the channel against epitaxial regrowth, and additional barrier material is epitaxially regrown in the access region or regions. In example embodiments, the regrown material has the same composition as the underlying barrier material or a composition similar to it.

The protective dielectric layer is subsequently removed to allow space for placement of the gate metal in contact with the barrier layer in the channel region of the device. The metal stack for the source and drain contacts, the gate contact, dielectric passivation, and pads for testing and packaging are added, exemplarily by conventional processes.

Various embodiments may include the incorporation of design enhancements such as field plates and air bridges.

DETAILED DESCRIPTION

Figure 1:
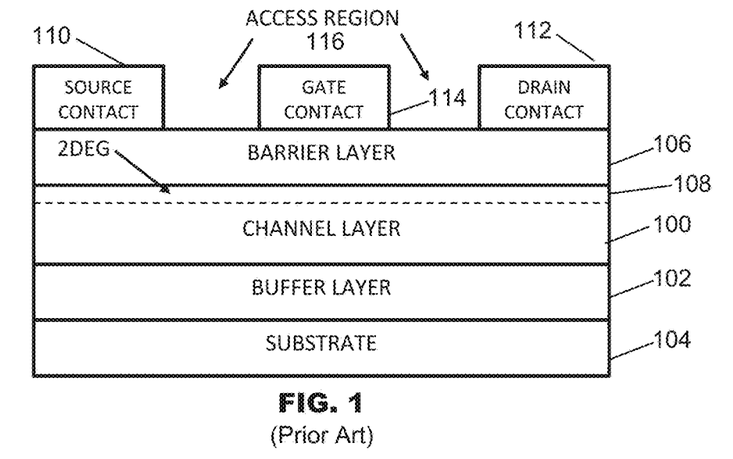
FIG. 1 is a notional diagram of a HEMT as known in the prior art.

FIG. 1 is a notional diagram of a HEMT as known in the prior art. Various details have been omitted to simplify the presentation. The HEMT is a heterojunction device. The channel layer 100 is shown in the figure as overlying a buffer layer 102 and a substrate 104. The channel layer has a smaller bandgap than the overlying barrier layer 106. Additionally, the wider-bandgap barrier layer can be doped n-type to contribute conduction electrons, although there are implementations that are operative without this feature. In operation, conduction electrons accumulate in a potential well that forms on the channel-layer side of the channel-barrier interface, thus forming a two-dimensional electron gas (2DEG) 108. The 2DEG provides a low-resistivity path through the device channel.

Typically, the metal contact layers 110, 112 for the source and drain are designed to make Ohmic contact to the underlying semiconductor material, whereas the gate contact 114 is designed to form a Schottky junction with the underlying semiconductor. The gate metal does not typically cover the entire area between the source and the gate. Instead, the gate metal is bounded by a so-called access region or access regions 116 as indicated in the figure.

$AlN/Al_{0.85}Ga_{0.15}N$ High Electron Mobility Transistor with Regrown Contact Regions HEMTs based on the AlGaN/GaN materials system are attracting increasing attention, especially for applications in radio-frequency electronics and power switching. In some examples, the channel and barrier layers have compositions represented respectively by $Al_xGa_{1-x}N$ and $Al_yGa_{1-y}N$, where y is greater than x. The greater proportion of aluminum relative to gallium in the barrier layer causes the barrier-layer bandgap to be greater than the channel-layer bandgap. In the limit of y=1, an AlN barrier layer can be provided.

There is interest in increasing the aluminum coefficient x in the channel layer in order to drive up the breakdown voltage (which scales with bandgap), and by that token to increase the LFOM. An optimal tradeoff is believed to exist near x=0.85, because the sheet charge $n_s$ falls off for greater values of x.

In Albert G. Baca et al., "An $AlN/Al_{0.85}Ga_{0.15}N$ high electron mobility transistor," *Appl. Phys. Lett.* 109, 033509 (2016) (hereinafter, "Baca 2016"), the entirety of which is hereby incorporated herein by reference, we reported a HEMT with an AlN barrier layer and an AlGaN channel layer with x=0.85.

Figure 2A:
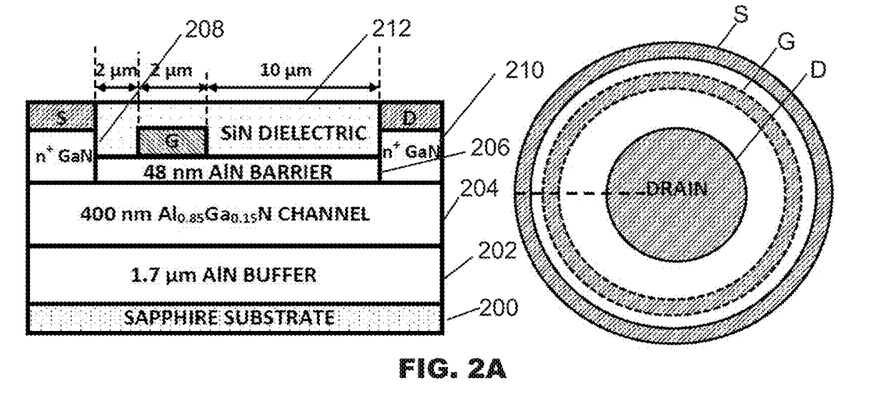
FIG. 2A schematically shows an $AlN/Al_{0.85}Ga_{0.15}N$ HEMT. As seen, the left-hand image in the figure is a cross section, and the right-hand image is a plan view.

Our AlN/Al$_{0.85}$Ga$_{0.15}$N HEMT, as reported in Baca 2016, is shown schematically in FIG. 2A. As seen, the left-hand image in the figure is a cross section, and the right-hand image is a plan view.

The epitaxial layer structure for the HEMT of FIG. 2A was grown by metal organic chemical vapor deposition (MOCVD) on a sapphire substrate 200. The essential elements of the epitaxial structure consisted of an AlN nucleation and buffer layer 202 grown thick enough, exemplarily 1.7 µm thick, to planarize on the sapphire substrate, a 400-nm, 85% Al-containing AlGaN buffer and channel layer 204, and a 48-nm-thick AlN barrier 206. All three of these layers were grown without intentional doping.

A circular HEMT with gate length of 2.0 µm and circumference of 314 µm (defined at gate center) was lithographically defined. The fabrication used six layers of photolithography.

First, the source and drain contacts 208, 210 were prepared by dry etching the AlN barrier and then regrowing n+ silicon-doped GaN in place of the etched-out AlN. The dry etch was done by inductively coupled plasma reactive ion etching (ICP-RIE) using a boron trichloride/chlorine/argon plasma. The GaN was regrown by MOCVD using a SiN dielectric mask. The regrowth procedure that we used bore certain similarities to the procedure known as epitaxial lateral overgrowth (ELOG).

In ELOG regrowth, the initial growth of the regrown material takes place through apertures in the dielectric mask. When the growth reaches the upper mask surface, it spreads laterally to overgrow the dielectric mask while continuing to grow vertically. This technique has been usefully applied in other contexts because the growth mechanisms related to the lateral growth suppress the upward propagation of threading discontinuities into the overgrown material.

Figure 2B:
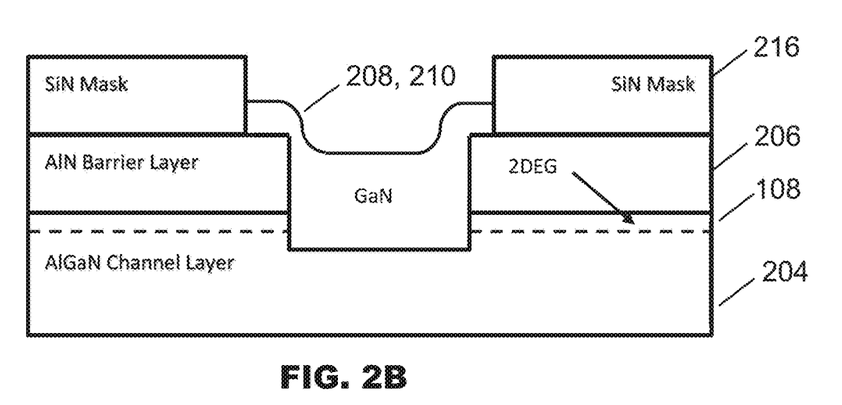
FIGS. 2B and 2C provide views of alternative structures for the source and drain contact regions of a HEMT that can be formed using a regrowth procedure described here.
Figure 2C:
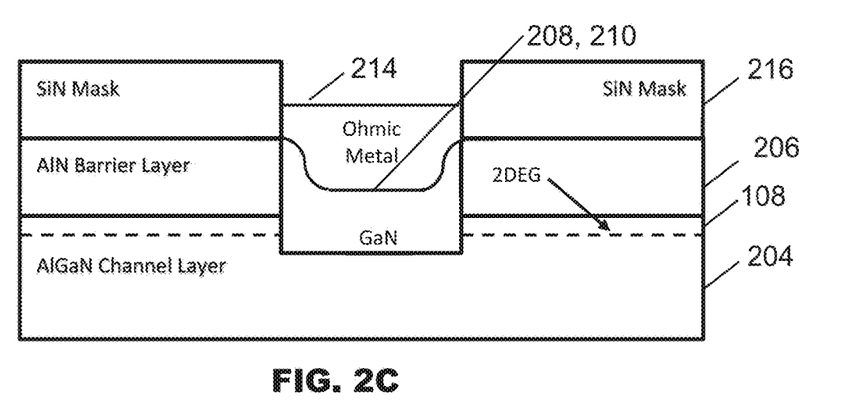

In our regrowth procedure, substrate areas where GaN deposition was not desired were protected by a SiN mask 216 (see FIGS. 2B and 2C). The GaN regrowth in the source and drain regions was an application of selective area growth (SAG) techniques, because the SiN mask suppressed GaN growth in the regions where it was not desired. In distinction to ELOG, however, we did not seek to overgrow the SiN dielectric mask with the regrown GaN.

FIG. 2A further shows metal contacts respectively labeled S, G, and D for the source, gate, and drain, and SiN passivation 212.

FIGS. 2B and 2C provide views of alternative structures for the source and drain contact regions that can be formed using our regrowth procedure. FIG. 2C additionally shows an Ohmic metal contact 214, which is formed in a later step. Like reference numerals are used where similar features are shown in preceding figures.

We confirmed by high-resolution scanning electron microscopy (SEM) that the GaN:Si had grown conformally over the exposed AlGaN and AlN surfaces. This is significant because it makes it less likely that an exposed and depleted AlGaN surface will add substantial parasitic resistance.

The SiN mask 216 was removed. An example removal technique is chemical mechanical polishing (CMP). Another example is wet etching, as described below in the section titled "An Al$_x$Ga$_{1-x}$N/Al$_y$Ga$_{1-y}$N HEMT with compositionally graded source and drain".

Conventional Ti/Al/Ni/Au metal stacks 214 for the source and drain were deposited with alloying by rapid thermal anneal (RTA) for thirty seconds at 850° C. A Schottky gate metal with a Ni/Au metal stack was formed between the source and drain contact regions. A SiN passivation and via etch was carried out. A second Ni/Au metal stack was deposited for pad metal. A further layer of SiN was deposited for more device passivation, and a via etch was performed using conventional techniques.

Testing of completed HEMTs that were fabricated as described above confirmed a breakdown voltage of 810 V, gate leakage within favorable limits, an $I_{on}/I_{off}$ current ratio greater than $10^7$, and a favorable subthreshold slope of 75 mV/decade.

The steps of the process flow described above are summarized in FIG. 3, to which reference will now be made.

Figure 3:
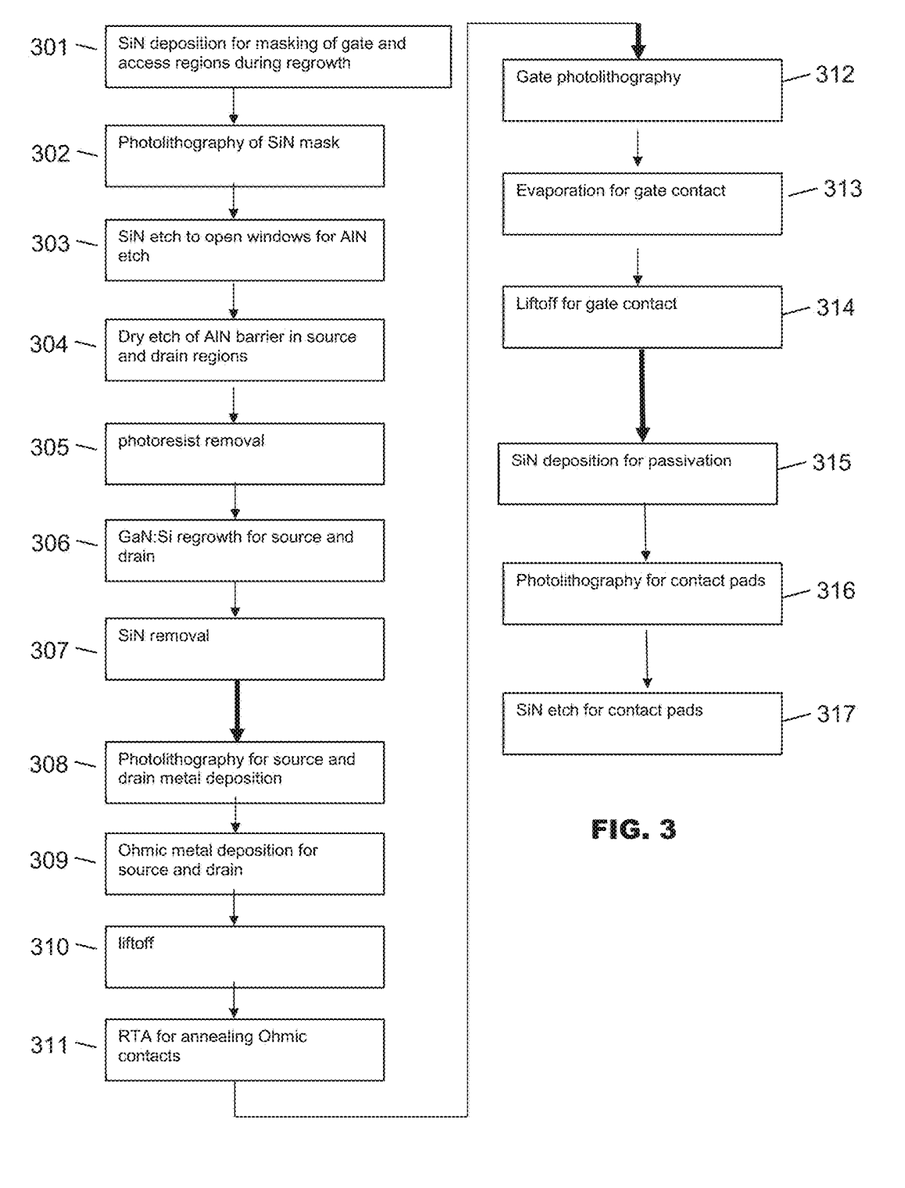
FIG. 3 summarizes the steps of a process flow for making the HEMT of FIG. 2A.

The regrowth of silicon-doped GaN is performed in steps 301-307. At 301, the SiN mask is deposited for masking the gate and access regions. At 302, the mask is photolithographically patterned using photoresist. At 303, windows are etched open in the SiN mask for etching of the underlying AlN. At 304, AlN is removed by dry etch from the source and drain regions. At 305, the photoresist is removed. At 306, the regrowth is performed for the source and drain. At 307, the SiN mask is removed.

The Ohmic contacts for the source and drain are fabricated in steps 308-311 using a liftoff process. At 308, the metal pattern is defined by photolithography. At 309, the metal for the Ohmic contacts is deposited through openings in a photoresist. At 310, the photoresist is lifted off. At 311, the contacts are annealed by RTA (rapid thermal anneal).

The metal gate contact is fabricated in steps 312-314 using a liftoff process. At 312, the metal pattern is defined by photolithography. At 313, the metal for the gate contact is deposited by evaporation through an opening in a photoresist. At 314, the photoresist is lifted off.

At 315, a SiN passivation layer is deposited. Openings for contact pads are photolithographically defined at 316 and etched in the SiN passivation layer at 317.

An Al$_1$Ga$_{1-x}$N/Al$_1$Ga$_{1-y}$N HEMT with Compositionally Graded Source and Drain As noted above, the channel layer of a HEMT is constructed from a material (e.g. Al$_x$Ga$_{1-x}$N) with both an abrupt interface to a barrier layer (e.g. Al$_y$Ga$_{1-y}$N) and a smaller bandgap than the barrier layer (thus in the AlGaN example, y>x) in order to provide charge confinement. Although large bandgaps for the channel and barrier layers contribute to a favorable LFOM, increasing the bandgaps can also make it more difficult to provide low-resistance contacts. In the Al$_x$Ga$_{1-x}$N/Al$_y$Ga$_{1-y}$N system, this problem becomes significant for x>0.3 and gets progressively worse as x approaches 0.9.

In some known approaches, the Al$_y$Ga$_{1-y}$N (nominally, higher-bandgap) semiconductor is graded from a high-aluminum AlGaN composition characteristic of the barrier layer to a low-aluminum AlGaN composition (or even a zero-aluminum GaN composition) at the surface.

This provides a solution to the problem of non-Ohmic contacts, because the contact metal layers form an interface with a semiconductor of lower bandgap. In the case of enhancement mode devices, however, it is preferable for devices made under this approach to include a recessed gate in the HEMT structure. Recessed gates are disadvantageous in some respects because, e.g., the recessed gate etching is difficult to control and has intrinsic non-uniformity. Moreover, including a recessed gate in the device structure may also lead to a need to add gate insulators to suppress leakage. Gate leakage tends to arise, for example, due to the creation of crystalline defects resulting from dry etching.

A recessed gate, AlGaN/GaN HEMT is reported, e.g., in V. Kumar et al., "Recessed 0.25 µm gate AlGaN/GaN HEMTs on SiC with high gate-drain breakdown voltage using ICP-ME", *Elec. Lett.* 37, 1483 (2001), and in Y. Okamoto et al., "Improved Power Performance for a Recessed-Gate AlGaN—GaN Heterojunction FET With a Field-Modulating Plate," *IEEE Trans. Microwave Th. Tech.*, 52, 2536 (2004).

We have a new approach for reducing contact resistance. A device embodying our new approach is shown in notional cross section in FIG. 4, to which reference will now be made. Like reference numerals are used in the figure where similar features are shown in preceding figures.

Figure 4:
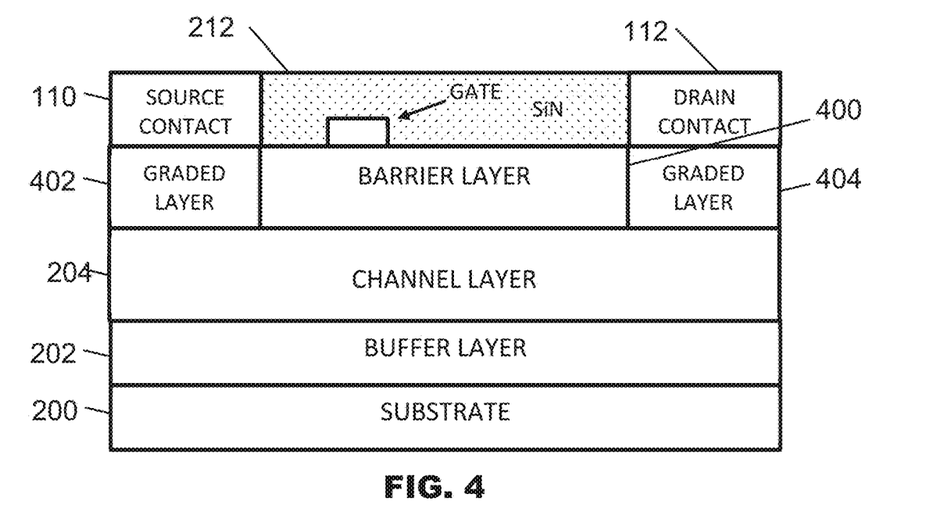
FIG. 4 shows, in notional cross section, an approach for reducing contact resistance as described here.

In our new approach, we selectively etch out voids in the barrier layer 400, but only in the source and drain regions. We then fill the voids by regrowing AlGaN source and drain contact regions 402, 404 with compositional grading of the regrown AlGaN in order to provide Ohmic contacts. The semiconductor region between the source and drain is protected by a dielectric hard mask layer such as a silicon nitride layer to prevent overgrowth by the graded AlGaN contact material.

An epitaxial regrowth process would be advantageous for assuring that the graded AlGaN grows only in the source and drain contact region and not on top of the protective mask. However, we have not at present identified a protective layer composition that is suitable when the aluminum coefficient x is non-zero. The reason is that aluminum has a high sticking coefficient to many, if not all, of the known insulator materials.

We therefore adopted an alternative approach in which during the source and drain growth of the graded material, the material is also deposited on top of the protective layer, from which it is subsequently removed. Chemical mechanical polishing (CMP) is one possible method for removing the graded AlGaN from the region of the protective layer without removing it from the source and drain regions.

The graded material deposited on the protective layer will typically be non-single-crystalline. Typically, when material is not single-crystalline, it is more readily removed by etching than comparable single-crystalline material. This facilitates the removal of the graded material by chemical etching as an alternative to CMP.

Of course the removal of the graded layer from over the SiN protective layer may have the undesirable side effect of also removing some of the regrown layer from the region where it is wanted. We have observed, however, that group III terminated surfaces tend to resist etching by potassium hydroxide. Epitaxially grown AlGaN, particularly if grown with a c-axis orientation, will have surfaces terminated by gallium atoms and to some extent by aluminum atoms. Such surfaces can serve as effective etch stops for suitable wet etchants. We have found that one etchant suitable in this regard is AZ 400K, a well-known photolithography developer based on buffered potassium hydroxide.

We have found that an etch using a potassium hydroxide based wet etchant such as AZ 400K will benefit both from the non-single-crystalline morphology of the graded layer in the regions from which it is to be removed, and from its intrinsic resistance to etching in the regions where it is to be retained. Accordingly, it is possible to expose the SiN protective layer without significant damage to the desired regrowth. As noted, the exposed SiN can later be removed in a separate etching step.

Figure 5:
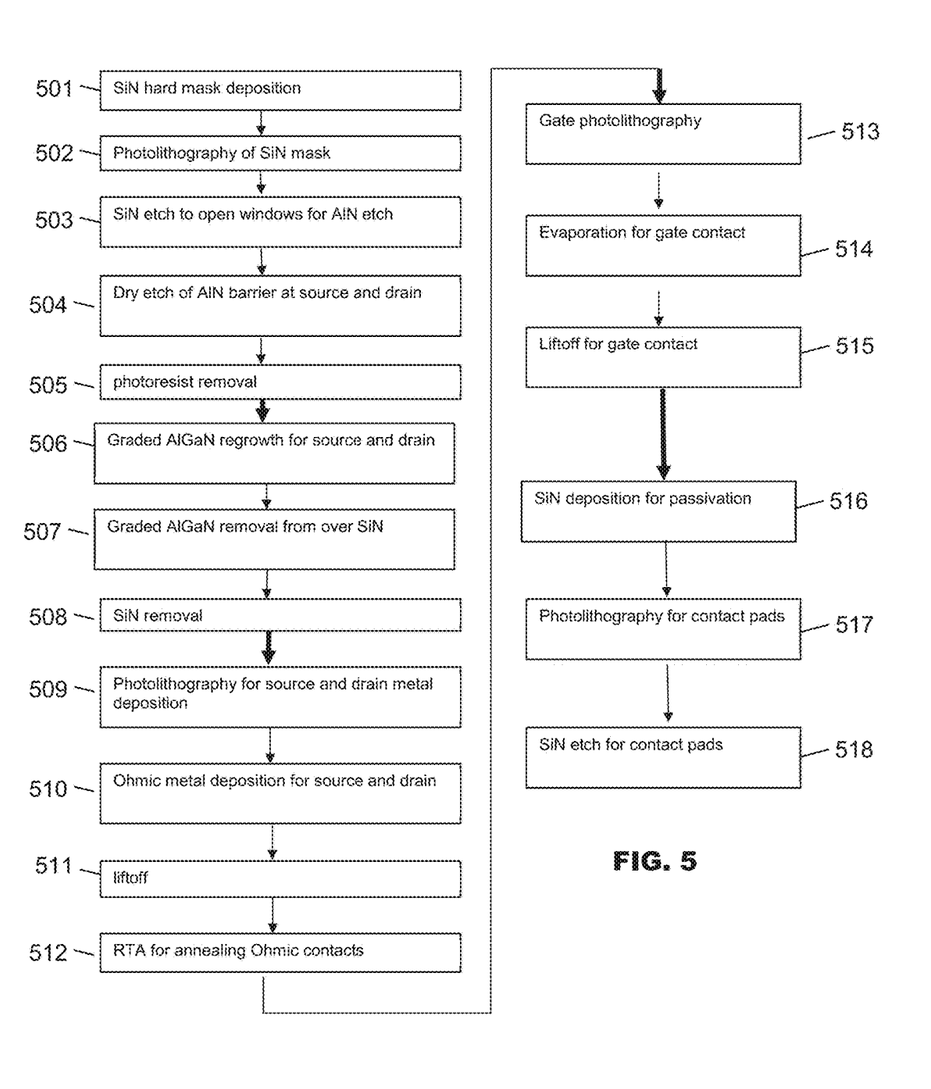
FIG. 5 is a flowchart of an example implementation of a process flow, as described here, for fabricating the HEMT of FIG. 4.

FIG. 5 is a flowchart of an example implementation of the process flow described above for fabricating the HEMT of FIG. 4. Reference will now be made to FIG. 5.

The voids in the AlN barrier layer are created in steps 501-508. The SiN protective layer is deposited as a hard mask at 501, photolithographically defined using a photoresist at 502, and etched at 503 to open windows for etching the underlying AlN. The source and drain regions of the AlN barrier layer are etched through the opened windows at 504, and the photoresist is removed at 505.

The metal contacts for the source and drain are fabricated using a liftoff process in steps 509-512. The photoresist is deposited and patterned at 509. The contact metal is deposited at 510. The photoresist is lifted off at 511, and the contacts are annealed by RTA at 512.

The metal gate contact is created in steps 513-515 using a liftoff process. The photoresist is deposited and patterned at 513. The gate metal is evaporatively deposited at 514. The photoresist is lifted off at 515.

A SiN passivation layer is deposited at 516, photolithographically patterned for contact pads at 517, and etched for the contact pads at 518.

HEMT with Access Region Regrowth

We have developed a technique for improving the channel resistivity in III-nitride HEMTs such as $Al_xGa_{1-x}N/Al_yGa_{1-y}N$ HEMTS by regrowing semiconductor material in the access region or access regions. A HEMT made according to our new technique is shown in notional cross section in FIG. 6, to which reference will now be made. Like reference numerals are used in the figure where similar features are shown in preceding figures.

Figure 6:
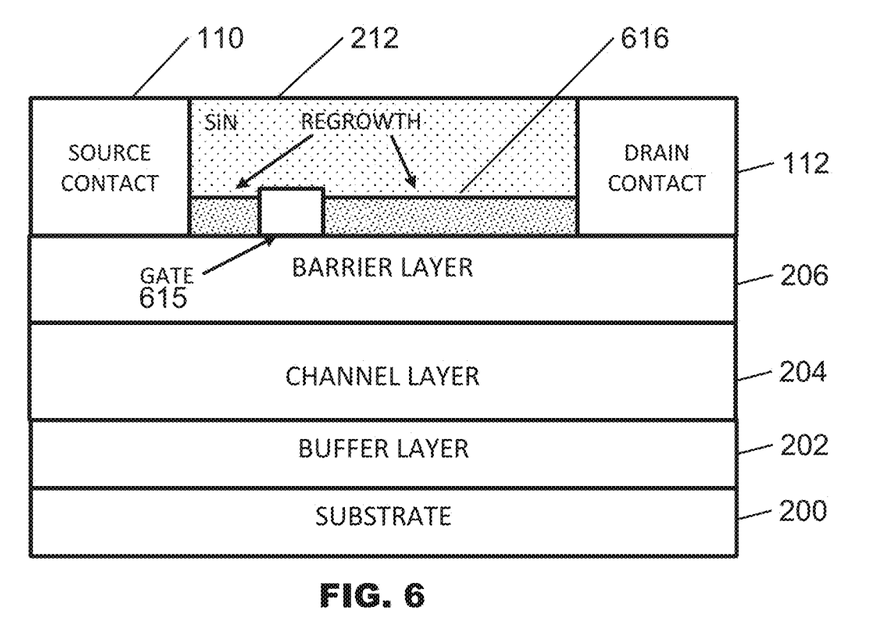
FIG. 6 shows, in notional cross section, a HEMT made according to a new technique for improving channel resistivity as described here.

An initial epitaxial growth of $Al_xGa_{1-x}N/Al_yGa_{1-y}N$ is chosen to set the threshold voltage of the HEMT for enhancement-mode operation. This step uses an epitaxial growth process that is optimized for HEMT operation. The thickness of the HEMT barrier layer 206 can be selected as a design parameter for setting the threshold voltage.

The wafer is then masked with a dielectric hard mask layer suitable for protection of the HEMT channel against epitaxial regrowth. One example of a suitable masking material is SiN.

The dielectric mask is patterned using photoresist and a lithography step followed by etching to open or define regions of the wafer for regrowth.

The photoresist is then removed. Then, the SiN-patterned HEMT structure is transported to an epitaxial growth chamber for regrowth, exemplarily by metal organic chemical vapor deposition (MOCVD).

The regrown material 616 will typically have the same composition as the underlying barrier layer 206 or a similar composition to it, although this is not a strict requirement. For some applications, it may be advantageous to grade the composition of the regrown material. For example, the regrowth can have a bandwidth that initially matches the composition of the underlying barrier layer, but that progressively decreases. An example is an $Al_xGa_{1-x}N$ composition in which x is initially 1 or a relatively high value less than 1, and x decreases during the regrowth.

Selective area growth (SAG) would be possible for some compositions of regrown material if a selective mask composition were available that would exclude the regrown material from over the protected areas. However, it will be more typical for a regrown material such as AlGaN to coat the entire wafer, including the protective masking layer. In such a case the regrown barrier layer may be removed from the protective mask layer by a technique such as chemical-mechanical polishing (CMP) or wet etching.

The protective layer is subsequently removed to allow space for placement of the gate metal 615 in contact with the barrier layer in the channel region of the device. An example removal technique is chemical mechanical polishing (CMP). Another example is wet etching, as described above in the section titled "An $Al_xGa_{1-x}N/Al_yGa_{1-y}N$ HEMT with compositionally graded source and drain".

Conventional process steps are followed for placement of the metal stack for the source and drain contacts, placement of the gate contact, dielectric passivation 212, and placement of pads for testing and packaging. Any of various design features known as enhancements for HEMT devices may be included. Examples of such features are field plates and air bridges.

Figure 7:
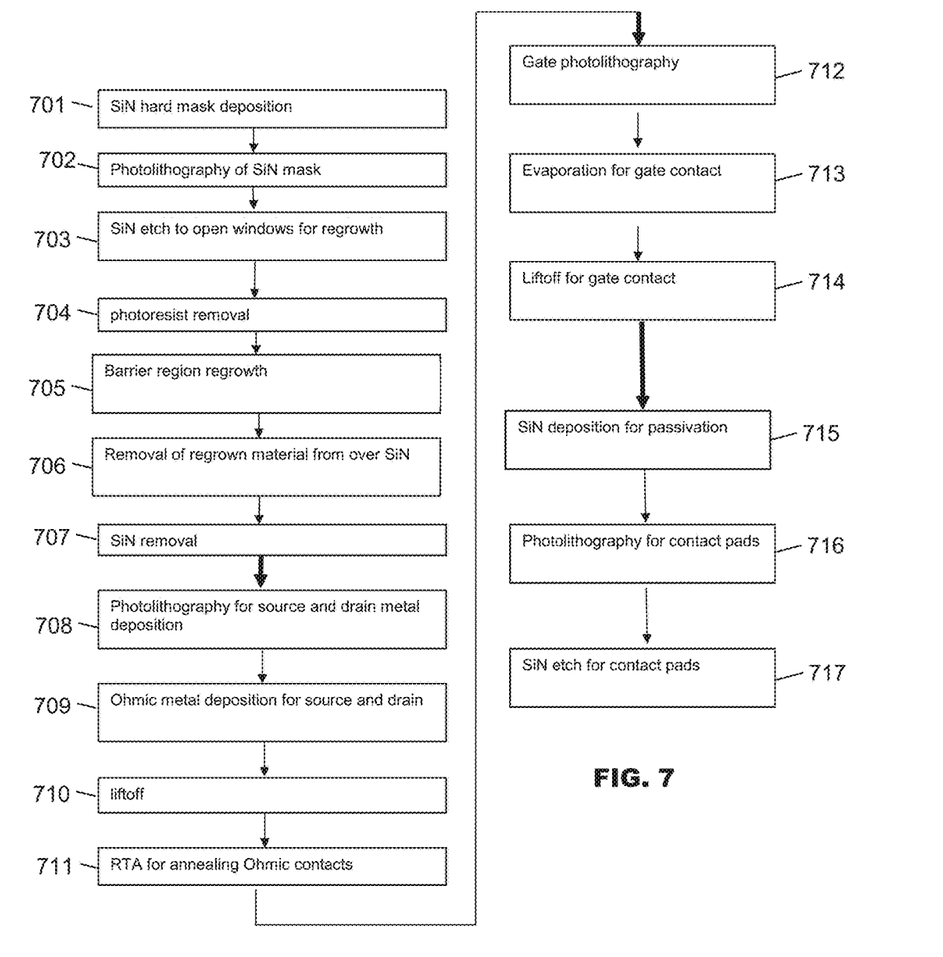
FIG. 7 is a flowchart of an example process, as described here, for fabricating the HEMT of FIG. 6.

FIG. 7 is a flowchart of an example process as described above for fabricating the HEMT of FIG. 6. Reference will now be made to FIG. 7.

The access region regrowth is performed at steps 701-707. A SiN hard mask is deposited at 701, photolithographically patterned using a photoresist at 702, and etched at 703 to open windows for the regrowth. The photoresist is removed at 704. The regrowth of barrier-region material is performed at 705, regrown material is removed at 706 from over the SiN hard mask, and the SiN hard mask is removed at 707.

The metal contacts for the source and drain are fabricated using a liftoff process in steps 708-711. The photoresist is deposited and patterned at 708. The contact metal is deposited at 709. The photoresist is lifted off at 710, and the contacts are annealed by RTA at 711.

The metal gate contact is created in steps 712-714 using a liftoff process. The photoresist is deposited and patterned at 712. The gate metal is evaporatively deposited at 713. The photoresist is lifted off at 714.

A SiN passivation layer is deposited at 715, photolithographically patterned for contact pads at 716, and etched for the contact pads at 717.

COMBINED TECHNIQUES

Either of the techniques described above for regrowing source and drain contact material may be combined with the above-described technique for regrowing additional barrier layer material in the access regions. Thus the benefits of both types of techniques may be enjoyed in the same resulting HEMT device.

What is claimed is:

1. A method for fabricating a high electron mobility transistor, comprising:
   epitaxially growing a III-nitride channel layer on a substrate;
   epitaxially growing a III-nitride barrier layer on the channel layer;
   depositing a dielectric mask layer on the barrier layer;
   opening a window through the dielectric mask layer in a source region and in a drain region;
   etching through the source region window and through the drain region window so as to remove barrier layer material and thereby leave a void in the barrier layer reaching down to an exposed upper surface of the channel layer; and
   filling the voids in the source and drain regions by epitaxial regrowth of a III-nitride contact material that differs in composition from the barrier layer;
   wherein the III-nitride contact material is regrown with a graded composition that initially matches the channel layer composition but progressively decreases in bandgap during the regrowth.

2. The method of claim 1, wherein the III-nitride contact material has an $Al_xGa_{1-x}N$ composition, x is at least 0 and at most 1, and x decreases during the regrowth.

3. The method of claim 2, further comprising removing the III-nitride contact material from an upper surface of the dielectric mask layer after the regrowth has finished, and then removing the dielectric mask layer.

4. The method of claim 3, wherein the step of removing the dielectric mask layer is performed by etching the dielectric mask layer with a potassium hydroxide based etchant.

5. A high electron mobility transistor, comprising:
   an epitaxial III-nitride channel layer of $Al_{0.85}Ga_{0.15}N$ on a substrate;
   an epitaxial III-nitride barrier layer on the channel layer; and
   an epitaxial III-nitride contact-region regrowth, wherein:
   the contact-region regrowth consists of contact material grown on the channel layer;
   the contact-region regrowth fills voids in the barrier layer in a source region and in a drain region of the transistor;
   the contact-region regrowth is different in composition from the barrier layer; and
   the contact-region regrowth has a graded composition that decreases in bandgap with distance from the channel layer.

6. A high electron mobility transistor, comprising:
   an epitaxial III-nitride channel layer of $Al_{0.85}Ga_{0.15}N$ on a substrate;
   an epitaxial III-nitride barrier layer on the channel layer; and
   an epitaxial III-nitride contact-region regrowth, wherein:
   the contact-region regrowth consists of contact material grown on the channel layer;
   the contact-region regrowth fills voids in the barrier layer in a source region and in a drain region of the transistor; and
   the contact-region regrowth has a smaller bandgap than the barrier layer and a smaller bandgap than the channel layer.

* * * * *